United States Patent
Reinschmidt et al.

(10) Patent No.: US 7,088,166 B1
(45) Date of Patent: Aug. 8, 2006

(54) LVDS INPUT CIRCUIT WITH EXTENDED COMMON MODE RANGE

(75) Inventors: Robert M. Reinschmidt, Hollis, NH (US); Dilip Krishnamurthy, Nashua, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 21 days.

(21) Appl. No.: 10/871,582

(22) Filed: Jun. 17, 2004

Related U.S. Application Data

(60) Provisional application No. 60/480,361, filed on Jun. 19, 2003.

(51) Int. Cl.
*H03L 5/00* (2006.01)

(52) U.S. Cl. .......................... 327/333; 327/108; 326/30; 326/31; 326/32

(58) Field of Classification Search ............... None
See application file for complete search history.

(56) References Cited

U.S. PATENT DOCUMENTS

| | | | | |
|---|---|---|---|---|
| 3,725,804 A | * | 4/1973 | Langan | 330/69 |
| 4,833,418 A | * | 5/1989 | Quintus et al. | 330/9 |
| 5,392,784 A | * | 2/1995 | Gudaitis | 600/508 |
| 6,111,431 A | * | 8/2000 | Estrada | 326/83 |
| 6,292,028 B1 | * | 9/2001 | Tomita | 326/86 |
| 6,559,685 B1 | * | 5/2003 | Green | 327/57 |
| 6,590,422 B1 | * | 7/2003 | Dillon | 326/86 |
| 6,600,346 B1 | * | 7/2003 | Macaluso | 327/108 |
| 6,768,352 B1 | | 7/2004 | Maher et al. | 327/117 |
| 6,781,456 B1 | * | 8/2004 | Pradhan | 330/69 |
| 6,788,116 B1 | * | 9/2004 | Cook et al. | 327/108 |
| 6,791,377 B1 | * | 9/2004 | Ilchmann et al. | 327/108 |
| 6,900,663 B1 | | 5/2005 | Roper et al. | 326/183 |
| 2001/0004219 A1 | * | 6/2001 | Bangs et al. | 327/65 |
| 2004/0150634 A1 | * | 8/2004 | Lo et al. | 345/204 |

* cited by examiner

*Primary Examiner*—Tuan T. Lam
*Assistant Examiner*—Hiep Nguyen
(74) *Attorney, Agent, or Firm*—Blakely, Sokoloff, Taylor & Zafman LLP

(57) ABSTRACT

A low voltage differential signal (LVDS) input circuit with extended common mode range has been disclosed. One embodiment of the LVDS input circuit includes a first resistor coupled between a differential logic circuit and a first input pad, a second resistor coupled between the differential logic circuit and a second input pad, and a first and a second termination resistors coupled to the first and the second input pads, respectively, the first and second termination resistors being coupled to each other in series at a node to produce a common mode reference voltage at the node. Other embodiments are described and claimed.

16 Claims, 5 Drawing Sheets

--Prior Art--

US 7,088,166 B1

LVDS INPUT CIRCUIT WITH EXTENDED COMMON MODE RANGE

REFERENCE TO RELATED APPLICATION

This application claims the benefit of U.S. Provisional Application No. 60/480,361, filed on Jun. 19, 2003.

FIELD OF INVENTION

The present invention relates generally to integrated circuits, and more particularly, to low voltage differential signal (LVDS) input circuits.

BACKGROUND

Low-Voltage Differential Signaling (LVDS) is an interface standard that can be used for high-speed data transmission. By using low swing signals (typically about 300 mV), faster bit rates, lower power, and better noise performance can be achieved. The differential nature of signals generally allows for increased noise immunity and noise margins. Examples of applications that use LVDS signaling include hubs for data communications, base stations and switches for telecommunications, flat-panel displays, servers, peripheral devices (e.g., printers and digital copy machines), and high-resolution displays for industrial applications.

A conventional LVDS input circuit 100 is shown in FIG. 1. The LVDS input circuit 100 is commonly referred to as a LVDS receiver as well. The LVDS input circuit 100 includes two input pads 101 and 103, three n-type metal oxide semiconductor (NMOS) (i.e., n-channel) transistors Q1, Q2, and Q3, a termination resistor R1, and two pull-up resistors R2 and R3. The termination resistor R1 is coupled in between the two input pads 101 and 103. The LVDS input signals, lvds_in_p and lvds_in_n, are applied to the gates of the transistors Q1 and Q2 via the input pads 101 and 103, respectively. The transistors Q1 and Q2 form a differential gate. The transistor Q3 is biased by a predetermined voltage, nbias, to provide a current sink to the transistors Q1 and Q2. The pull-up resistors R2 and R3 couple the transistors Q1 and Q2, respectively, to a voltage supply, vddio 109. The output signals of the receiver circuit 100 are dfl_out_n and dfl_out_p at the drains of the transistors Q1 and Q2, respectively.

However, the above LVDS input circuit 100 is unsatisfactory because of several disadvantages. One disadvantage is the severely limited common mode range of the LVDS input circuit 100. The upper limit of the common mode range is limited by the power supply voltage (i.e., vddio 109 in FIG. 1). So, a 2.5V supply voltage is provided for a 2.5V common mode voltage. Furthermore, the lower limit of the common mode range is determined by the threshold voltage (Vt) of the NMOS transistors (Q1 and Q2) and the drain-to-source (Vds) voltage of the transistor Q3 of the current sink. As a result, the common mode range of the LVDS input circuit 100 is typically limited to a lower limit of at least about 0.8V.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 2:
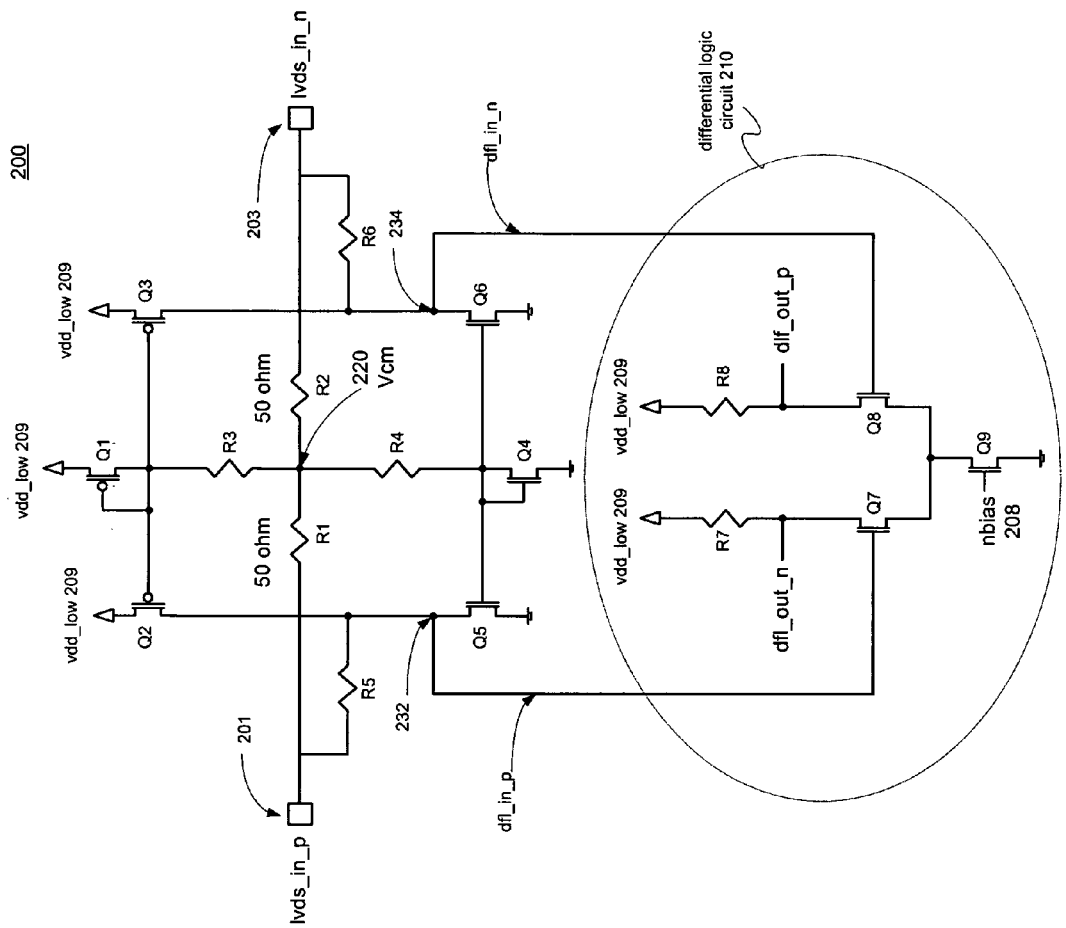
FIG. 2 shows one embodiment of a LVDS input circuit having an extended common mode range.

FIG. 2 shows one embodiment of a LVDS input circuit or receiver with an extended common mode range. The LVDS input circuit 200 includes two signal input pads 201 and 203, two termination resistors R1 and R2, four resistors R3, R4, R5, and R6, three p-type metal oxide semiconductor (PMOS) (i.e., p-channel) transistors Q1–Q3, three n-type metal oxide semiconductor (NMOS) (i.e., n-channel) transistors Q4–Q6, and a differential logic circuit 210. The differential logic circuit 210 includes two resistors R7 and R8, three NMOS transistors Q7–Q9. Each of the NMOS and PMOS transistors Q1–Q9 has a gate, a source, and a drain. Each of the termination resistors R1 and R2 and the resistors R3–R8 has a first end and a second end.

A pair of LVDS input signals, lvds_in_p and lvds_in_n, are input to the input pads 201 and 203, respectively. The input pads 201 and 203 are coupled to the termination resistors R1 and R2, respectively. The termination resistors R1 and R2 are coupled to each other at a common mode node 220. The voltage at the common mode node 220 may be referred to as the center tap voltage or the common mode reference voltage, Vcm. The resistance of the termination resistors R1 and R2 may be substantially the same. In one embodiment, both R1 and R2 are at approximately 50 ohms. In addition to the termination resistors R1 and R2, the input pads 201 and 203 are also coupled to the first ends of the resistors R5 and R6, respectively. The second ends of the resistors R5 and R6 are further coupled to the gates of the NMOS transistors Q7 and Q8, respectively. Besides the NMOS transistors Q7 and Q8, the second ends of R5 and R6 are also coupled to the transistors Q2 and Q5 and the transistors Q3 and Q6, respectively.

In one embodiment, the PMOS transistors Q1–Q3 are coupled to each other at their gates to form two pull-up current mirrors. The PMOS transistors Q1–Q3 may be referred to as the pull-up transistors. The gates of the PMOS transistors Q1–Q3 are further coupled to the resistor R3. The sources of the PMOS transistors Q1–Q3 are coupled to a power supply, vdd_low 209. Likewise, the NMOS transistors Q4–Q6 are coupled to each other at their gates to form two pull-down current mirrors. The NMOS transistors Q4–Q6 may be referred to as the pull-down transistors. The gates of the NMOS transistors Q4–Q6 are further coupled to the resistor R4. The resistors R3 and R4 are coupled to each other at the common mode node 220. The sources of the NMOS transistors Q4–Q6 are coupled to the ground. In one embodiment, the drains of the transistors Q2 and Q5 are coupled to each other at the node 232, and likewise, the drains of the transistors Q3 and Q6 are coupled to each other at the node 234.

In one embodiment, the differential logic circuit 210 is coupled to the pull-up and pull-down current mirrors at the nodes 232 and 234. Within the differential logic circuit 210, the sources of the NMOS transistors Q7 and Q8 may be coupled to the drain of the NMOS transistor Q9. The NMOS transistor Q9 may be biased by a predetermined voltage, nbias 208, at the gate of the NMOS transistor Q9 to provide a current sink for the NMOS transistors Q7 and Q8. The source of the NMOS transistor Q9 may be coupled to the ground. In one embodiment, the drains of the NMOS transistors Q7 and Q8 are coupled to the resistors R7 and R8, respectively. The resistors R7 and R8 are further coupled to the power supply, vdd_low 209. In one embodiment, the differential output voltages of the differential logic circuit 210, dfl_out_n and dfl_out_p, are output at the drains of the NMOS transistors Q7 and Q8, respectively.

One should appreciate that the embodiment of the LVDS input circuit 200 described above is for illustration, not limitation. Additional circuitry or electronic devices, such as electrostatic discharge (ESD) protection circuitry, not shown in FIG. 2 may be included in some embodiments of the LVDS input circuit without departing from the spirit and scope of the appending claims. However, some embodiments of the LVDS input circuit may not include all components shown in FIG. 2.

In one embodiment, the pair of LVDS input signals, lvds_in_p and lvds_in_n, are applied to the input pads 201 and 203, respectively. The LVDS input signals are translated down through the resistors R5 and R6. Therefore, the resistors R5 and R6 may also be referred to as translation resistors. The voltage drops (also known as I*R drops) across the resistors R5 and R6 may be substantially constant in some embodiments, which is discussed in more detail with reference to an example below. The differential input signals are also applied via the input pads 201 and 203 to the termination resistors R1 and R2, respectively. As mentioned above, the termination resistors R1 and R2 are coupled to each other in series at the common mode node 220. In one embodiment, the termination resistors R1 and R2 are substantially the same. Therefore, Vcm at the common mode node 220 may approximately equal to the average voltage of the LVDS input signals, lvds_in_p and lvds_in_n.

In one embodiment, the gate and the drain of the PMOS transistor Q1 are coupled to each other to provide a pull-up current mirror reference current to the other two PMOS transistors Q2 and Q3. The PMOS transistors Q2 and Q3 may mirror the pull-up current mirror reference current through the PMOS transistor Q1. In one embodiment, the sizes of the PMOS transistors Q2 and Q3 are multiples of the size of the PMOS transistor Q1. Therefore, the currents through the PMOS transistors Q2 and Q3 may substantially equal to the corresponding multiples of the pull-up current mirror reference current.

Like the PMOS transistors Q1–Q3, the NMOS transistors Q4–Q6 may be coupled to each other at their gates to form two pull-down current mirrors. In one embodiment, the gate and the drain of the NMOS transistor Q4 are coupled to each other to provide a pull-down current mirror reference current to the other two NMOS transistors Q5 and Q6. The NMOS transistors Q5 and Q6 may mirror the pull-down current mirror reference current through the NMOS transistor Q4. In one embodiment, the sizes of the NMOS transistors Q5 and Q6 are multiples of the size of the NMOS transistor Q4. Therefore, the currents through the NMOS transistors Q5 and Q6 may substantially equal to the corresponding multiples of the pull-down current mirror reference current.

The operation of the current mirrors may be further illustrated by the following example. Suppose both the sizes of the PMOS transistors Q2 and Q3 equal to K times the size of the PMOS transistor Q1 and both the sizes of the NMOS transistors Q5 and Q6 also equal to K times the size of the NMOS transistor Q4, where K is a number. Furthermore, the lengths of the transistors Q1–Q6 substantially equal to each other, while the widths of the transistors Q1–Q6 are Wq1, Wq2, Wq3, Wq4, Wq5, and Wq6, respectively. Then K is related to the transistor widths by the following equations:

$$K=Wq2/Wq1=Wq3/Wq1=Wq5/Wq4=Wq6/Wq4;$$

and the currents through the transistors Q1–Q6 are related to each other as follows:

Iq2=Iq3=K*Iq1, and

Iq5=Iq6=K*Iq4, where Iq1, Iq2, Iq3, Iq4, Iq5, and Iq6 are the currents through the transistors Q1–Q6, respectively.

Referring back to FIG. 2, the current through R5, Ir5, and the current through Q2, Iq2, flows into the node 232 and the current through Q5, Iq5, flows out of the node 232. In general, the sum of currents flowing into a node substantially equals the sum of currents flowing out of the node. Therefore, Ir5=Iq5−Iq2. Likewise, at node 234, Ir6=Iq6−Iq3, where Ir6, Iq6, and Iq3 are the currents flowing through R6, Q6, and Q3, respectively. As mentioned above, the constant multiple, K, is used for the pull-up and pull-down current mirrors in the current example, and thus, Iq2 may substantially equal to Iq3 and Iq5 may substantially equal to Iq6. Hence, Ir5 may substantially equal to Ir6.

In one embodiment, the resistances of the resistors R5 and R6 substantially equal to each other, and hence, the voltage drops across the resistors R5 and R6 (i.e., Ir5*R5 and Ir6*R6, respectively) are substantially the same. The voltages at the input pads 201 and 203 can be translated up or down through the resistors R5 and R6 to produce the differential input signals, dfl_in_p and dfl_in_n, at the gates of the NMOS transistors Q7 and Q8, respectively. In one embodiment, the difference between the LVDS input signals, lvds_in_p and lvds_in_n, is substantially the same as the difference between the differential input signals, dfl_in_p and dfl_in_n. However, there may exist some attenuation in the signal swing at the gates of the NMOS transistors Q7 and Q8 due to the finite impedance of the transistors Q1–Q6.

When the differential input signals, dfl_in_p and dfl_in_n, are input to the differential logic circuit 210 via the transistors Q7 and Q8, the differential logic circuit 210 may amplify the signal swing of dfl_in_p and dfl_in_n. The differential logic circuit 210 may translate dfl_in_p and dfl_in_n to a vdd_low based reference. In one embodiment, the differential logic circuit 210 outputs a pair of differential output signals, dfl_out_n and dfl_out_p, to drive a differential based logic circuit. Alternatively, dfl_out_p and dfl_out_n may be converted into CMOS signals via conventional CMOS conversion circuitry to drive CMOS logic circuitry.

In sum, the termination resistors R1 and R2, the resistors R3–R6, and the transistors Q1–Q6 operate with each other to translate the LVDS input signals, lvds_in_p and lvds_in_n, into the differential input signals, dfl_in_p and dfl_in_n, at the gates of the NMOS transistors Q7 and Q8 in the differential logic circuit 210. Note that the NMOS transistor Q9 in the differential logic circuit 210 may fall out of saturation if dfl_in_p and dfl_in_n are below a predetermined threshold. Consequently, the NMOS transistors Q7–Q9 may start to turn off. However, if dfl_in_p and dfl_in_n are above another predetermined threshold, both the NMOS transistors Q7 and Q8 in the differential logic circuit 210 may be turned on. In either case, the differential logic circuit 210 may not operate properly.

Figure 1:
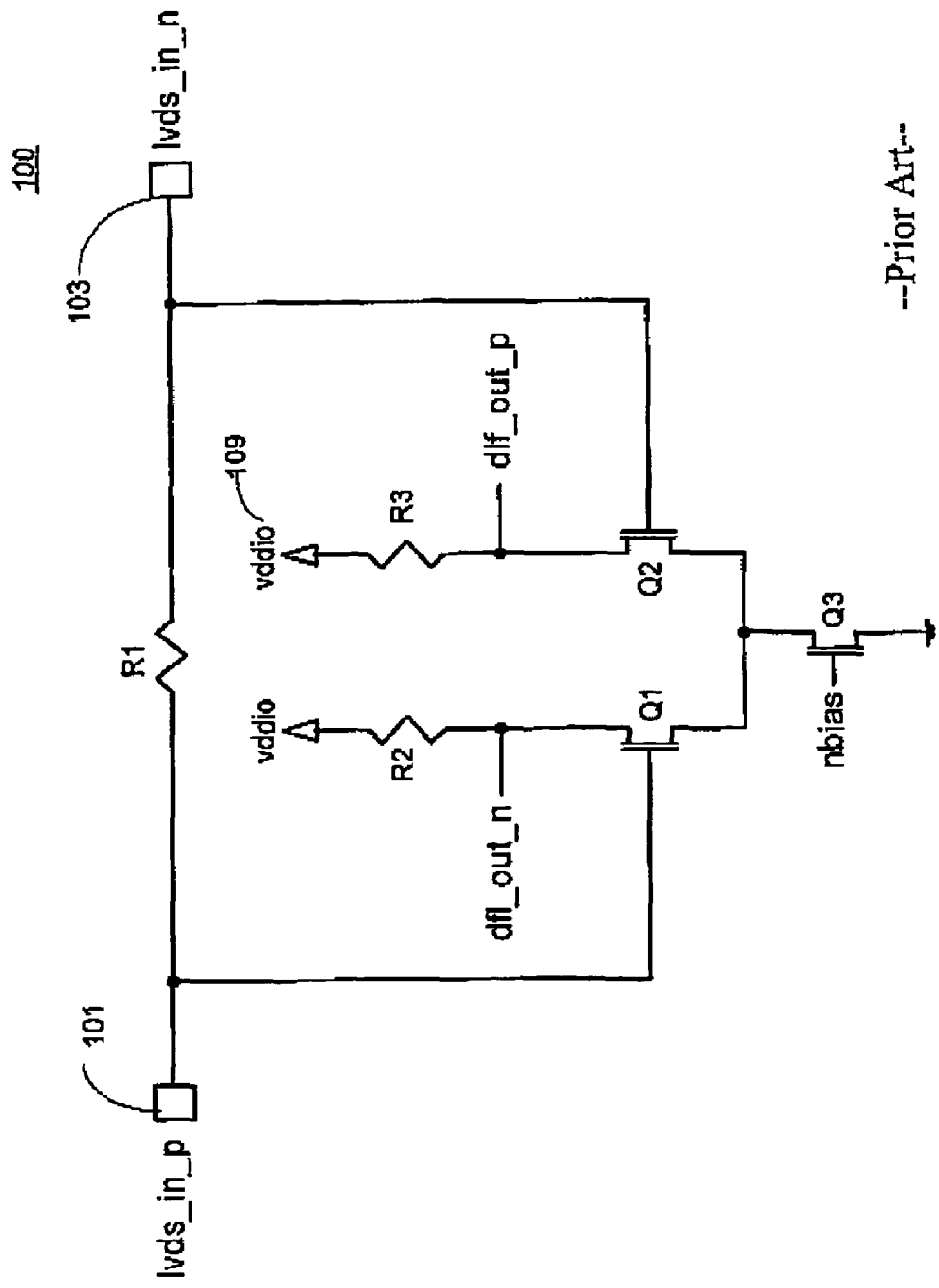
FIG. 1 shows a conventional LVDS input circuit.

One advantage of the LVDS input circuit 200 is the extension of the input common mode range. In one embodiment, the extended common mode range goes from about 0.6V to, at least, about 2.4V. Also, unlike the conventional LVDS input circuit 100 shown in FIG. 1, which uses a voltage supply of at least about 2.5V in order to provide a common mode voltage of 2.5V, the voltage supply of the LVDS input circuit 200, vdd_low 209, can be lowered to approximately 1.2V. In one embodiment, vdd_low 209 is an externally supplied voltage. Alternatively, vdd_low 209 may be provided by an internally regulated power supply.

Furthermore, since the input circuit 200 uses a lower voltage supply, the transistors Q1–Q9 in the input circuit 200 may include one or more low-voltage transistors and/or thin-oxide transistors. The low-voltage transistors and/or thin-oxide transistors allows the input circuit 200 to operate at higher frequencies, such as, approximately 200 MHz or above. Another advantage provided by the low-voltage transistors and/or thin-oxide transistors is a lower signal propagation delay. In some embodiments, other types of transistors, such as bipolar junction transistors (BJT), may be used instead of some or all of the PMOS and/or NMOS transistors Q1–Q9 in FIG. 2.

Figure 3:
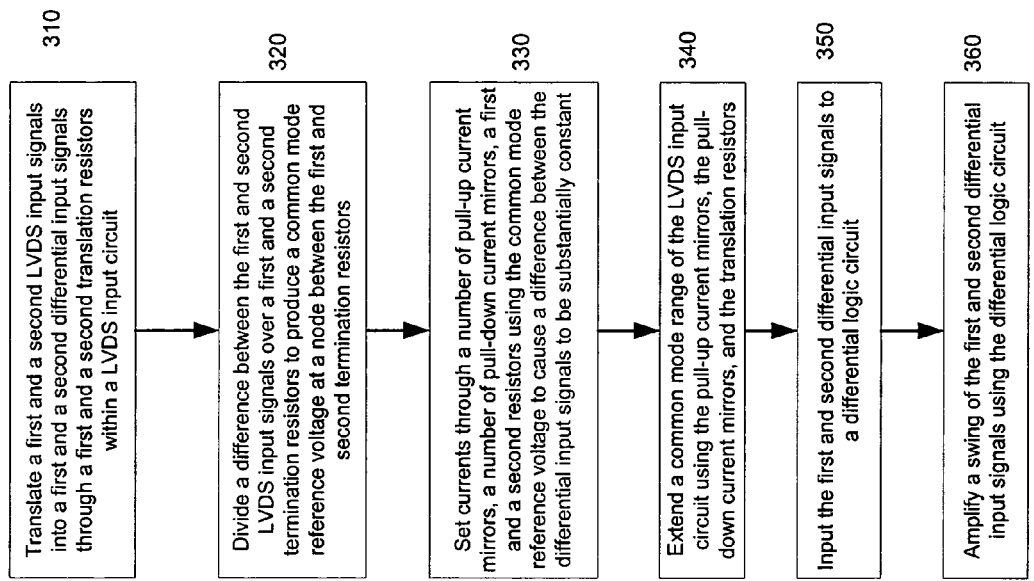
FIG. 3 shows one embodiment of a process to receive low voltage differential signals.

FIG. 3 shows one embodiment of a process to receive LVDS input signals using a LVDS input circuit. At block 310, a first and a second LVDS input signals are translated into a pair of differential input signals through a first and second translation resistors, respectively, within the LVDS input circuit. In one embodiment, the common mode voltage of the first and second LVDS input signals is modified when the first and second LVDS input signals are translated. Then at block 320, a difference between the first and second LVDS input signals are divided over a first and second termination resistors to produce a common mode reference voltage at a node between the first and second termination resistors.

Using the common mode reference voltage, currents are set through two pull-up current mirrors, two pull-down current mirrors, a first and a second resistors at block 330 to cause a difference between the differential input signals to be substantially constant. At block 340, the common mode range of the LVDS input circuit is extended using the pull-up current mirrors, the pull-down current mirrors, the first and the second translation resistors. At block 350, the first and second differential input signals are input to a differential logic circuit. In one embodiment, the differential logic circuit includes a differential Metal Oxide Semiconductor (MOS) amplifier and the first and second differential input signals are compatible with the differential MOS amplifier. At block 360, a swing of the differential input signals is amplified using the differential logic circuit.

Figure 4A:
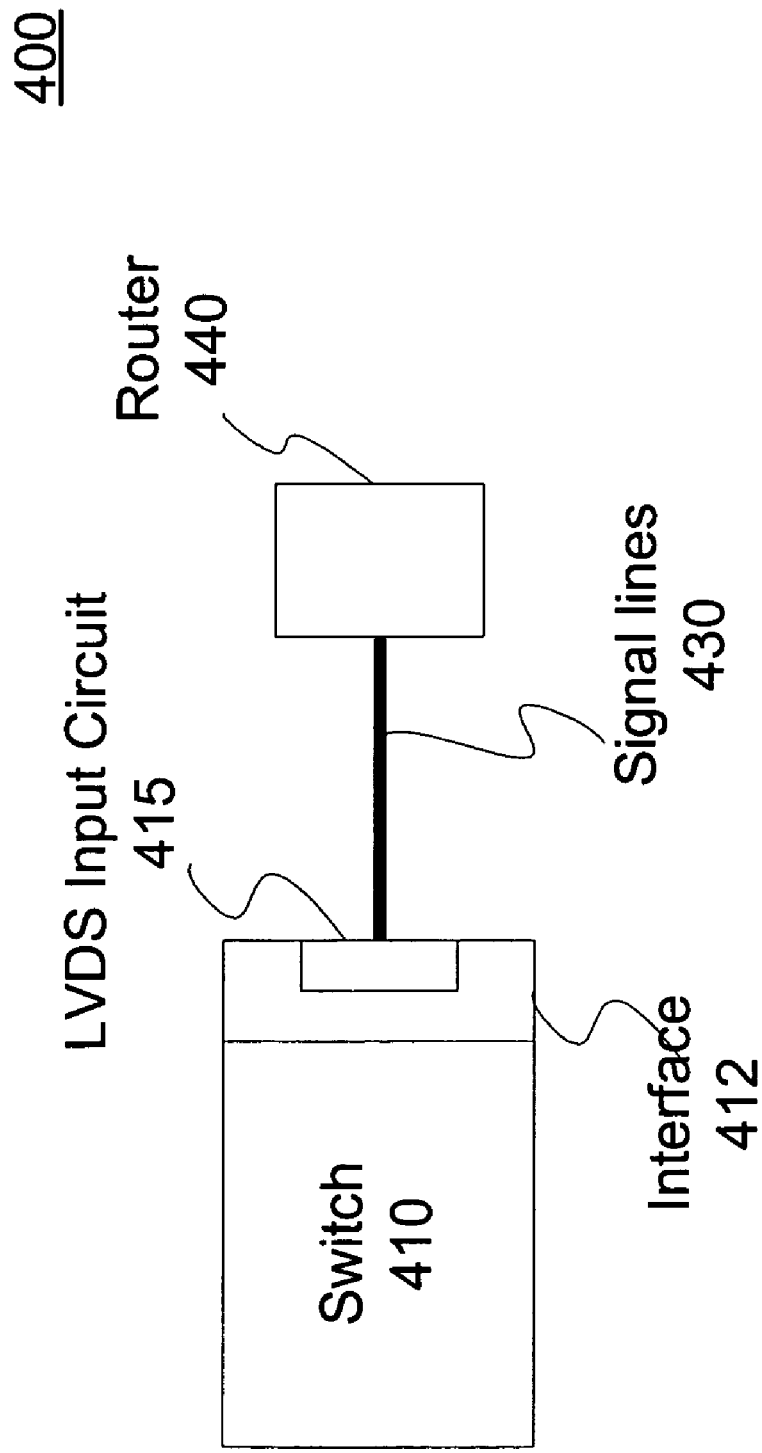
FIG. 4A shows one embodiment of a networked system.

FIG. 4A illustrates one embodiment of a networked system 400 usable with one embodiment of the LVDS input circuit. The system 400 includes a switch 410, transmission lines 430, and a router 440. The switch 410 further includes an interface 412 having a LVDS input circuit 415. The signal lines 430 couple the switch 410 via the LVDS input circuit 415 to the router 440. LVDS signals from the router 440 may propagate across the signal lines 430 to the switch 410. The LVDS input circuit 415 of the switch 410 receives the LVDS signals from the router 440. Exemplary embodiments of the LVDS input circuit 415 have been discussed above with reference to FIG. 2.

Figure 4B:
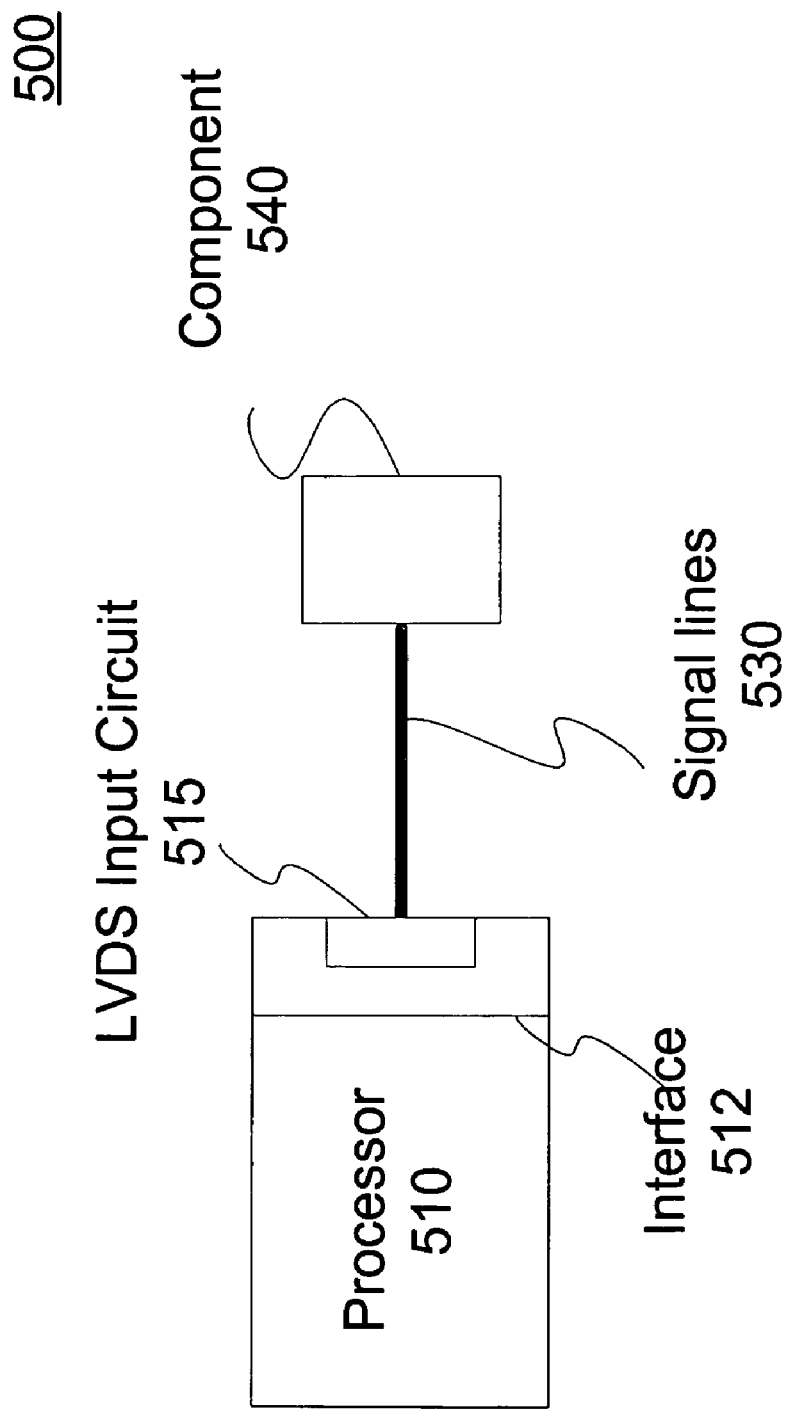
FIG. 4B shows one embodiment of a computing system.

FIG. 4B illustrates one embodiment of a computing system 500 usable with one embodiment of the LVDS input circuit. The computing system 500 includes a processor 510, signal lines 530, and a component 540. The component 540 may include a disk drive, a memory hub link, a peripheral device (e.g., a printer), etc. The processor 510 further includes an interface 512 having a LVDS input circuit 515. The signal lines 530 couple the processor 510 via the LVDS input circuit 515 to the component 540. LVDS signals from the component 540 may propagate across the signal lines 530 to the processor 510. The LVDS input circuit 515 of the processor 510 receives the LVDS signals from the component 540. Exemplary embodiments of the LVDS input circuit 515 have been discussed above with reference to FIG. 2.

Note that any or all of the components of the systems 400 and 500 and associated hardware may be used in various embodiments of the present invention. However, it can be appreciated that other configurations of the systems may include additional or fewer components than those illustrated in FIGS. 4A and 4B.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus, comprising:
   a first resistor coupled between a differential logic circuit and a first input pad;
   a second resistor coupled between the differential logic circuit and a second input pad;
   a first and a second termination resistors coupled to the first and the second input pads, respectively, the first and second termination resistors being coupled to each other in series at a node to produce a common mode reference voltage at the node;
   a plurality of pull-up current mirrors coupled to the first and second resistors; and
   a plurality of pull-down current mirrors coupled to the first and second resistors.

2. The apparatus of claim 1, further comprising:
   a third resistor coupled between the plurality of pull-up current mirrors and the node; and
   a fourth resistor coupled between the plurality of pull-down current mirrors and the node.

3. The apparatus of claim 1, wherein the plurality of pull-up current mirrors include a first, a second, and a third pull-up transistors, each of the first, second, and third pull-up transistors has a source, a gate, and a drain, the first, second, and third pull-up transistors are coupled to each other at the gates of the first, second, and third pull-up transistors, and the sources of the first, second, and third pull-up transistors are coupled to a power supply.

4. The apparatus of claim 3, wherein the power supply is at or above approximately 1.2V and a common mode range of a first and a second low voltage differential signal (LVDS) input signals at the first and second input pads, respectively, is from approximately 0.6V to approximately 2.4V.

5. The apparatus of claim 3, wherein the plurality of pull-down current mirrors includes a first, a second, and a third pull-down transistors, each of the first, second, and third pull-down transistors has a source, a gate, and a drain, the first, second, and third pull-down transistors are coupled to each other at the gates of the first, second, and third pull-down transistors, and the sources of the first, second, and third pull-up transistors are coupled to a ground.

6. The apparatus of claim 1, further comprising:
a network interface device including the differential logic circuit, the first and second resistors, and the first and second termination resistors; and
a plurality of signal lines coupled to the network interface device to propagate signals to the network interface.

7. The apparatus of claim 6, further comprising:
a switch including the network interface device; and
a router coupled to the plurality of signal lines to send the signals over the signal lines to the switch.

8. The apparatus of claim 6, further comprising:
a processor including the network interface device; and
a storage device coupled to the plurality of signal lines to send the signals over the signal lines to the processor.

9. A method, comprising:
translating a first and a second low voltage differential signal (LVDS) input signals into a first and a second differential input signals through a first and a second translation resistors, respectively, within a LVDS input circuit;
inputting the first and the second differential input signals to a differential logic circuit within the LVDS input circuit;
dividing a difference between the first and the second LVDS input signals over a first and a second termination resistors, which are coupled to each other in series, to produce a common mode reference voltage at a node between the first and the second termination resistors; and
setting currents through a plurality of pull-up current mirrors, a plurality of pull-down current mirrors, a first resistor, and a second resistor using the common mode reference voltage to cause a difference between the differential input signals to be substantially constant, wherein the first resistor is coupled between the node and the plurality of pull-up current mirrors and the second resistor is coupled between the node and the plurality of pull-down current mirrors.

10. The method of claim 9, further comprising:
extending a common mode range of the LVDS input circuit using the plurality of pull-up current mirrors, the plurality of pull-down current mirrors, and the first and second translation resistors.

11. The method of claim 9, further comprising amplifying a swing of the first and the second differential input signals using the differential logic circuit.

12. An apparatus, comprising:
means for extending an upper limit of a common mode range of a first and a second low voltage differential signal (LVDS) input signals beyond a power supply voltage provided to the LVDS input circuit; and
means for producing a first and a second substantially constant differential input signals from the first and the second LVDS input signals, wherein the means for producing a first and a second substantially constant differential input signals comprises a plurality of pull-up current mirrors and a plurality of pull-down current mirrors.

13. The apparatus of claim 12, wherein the power supply voltage is at or above approximately 1.2V and the common mode range of the first and the second LVDS input signals is from approximately 0.6V to approximately 2.4V.

14. The apparatus of claim 12, further comprising:
means for amplifying a swing of the first and the second differential input signals.

15. A method, comprising:
translating a pair of differential signals to modify a common mode voltage of the pair of differential signals such that the translated pair of differential signals is compatible with a differential Metal Oxide Semiconductor (MOS) amplifier;
inputting the translated pair of differential signals into the differential MOS amplifier; and
setting currents through a plurality of pull-up current mirrors and a plurality of pull-down current mirrors to cause a difference between the pair of differential signals to be substantially constant.

16. The method of claim 15, further comprising:
amplifying the translated pair of differential signals using the differential MOS amplifier.

* * * * *